(12) United States Patent
Huang et al.

(10) Patent No.: US 9,129,510 B2
(45) Date of Patent: Sep. 8, 2015

(54) MONITORING OPERATING CONDITION OF ELECTRICAL COMPONENT

(71) Applicant: ABB Technology AG, Zurich (CH)

(72) Inventors: Wei Huang, Oviedo, FL (US); Khoi Nguyen, Sanford, FL (US); Douglas A. Voda, Sanford, FL (US); David C. Lawrence, Raleigh, NC (US); Harshavardhan M. Karandikar, Longwood, FL (US)

(73) Assignee: ABB TECHNOLOGY AG, Zurich (CH)

( * ) Notice: Subject to any disclaimer, the term of this patent is extended or adjusted under 35 U.S.C. 154(b) by 247 days.

(21) Appl. No.: 13/687,514

(22) Filed: Nov. 28, 2012

(65) Prior Publication Data
US 2014/0145849 A1 May 29, 2014

(51) Int. Cl.
  *G08B 21/00* (2006.01)
  *G08B 21/18* (2006.01)
  *G01R 31/327* (2006.01)
  *H02H 6/00* (2006.01)

(52) U.S. Cl.
  CPC ............ *G08B 21/182* (2013.01); *G01R 31/327* (2013.01); *G01R 31/3277* (2013.01); *H02H 6/00* (2013.01)

(58) Field of Classification Search
  None
  See application file for complete search history.

(56) References Cited

U.S. PATENT DOCUMENTS

2004/0017289 A1 * 1/2004 Brown, Jr. .................. 340/442
2010/0121500 A1   5/2010 Karandikar et al.

FOREIGN PATENT DOCUMENTS

EP   1887673 A1   2/2008
EP   2276135 A1   1/2011
WO   2011005254 A1   1/2011

OTHER PUBLICATIONS

Int. Search Report cited in PCT Application No. PCT/US2013/071814 dated Mar. 21, 2014, 10 pgs.

* cited by examiner

*Primary Examiner* — Travis Hunnings

(57) ABSTRACT

Among other things, one or more techniques and/or systems are provided for monitoring an operating condition of an electrical component, such as electrical switchgear. In one example, temperatures associated with an electrical conductor connection within the electrical component may be evaluated against one or more expected temperatures curves derived from a linear regression model to determine whether the electrical conductor connection has failed or is starting to fail. In another example, temperature readings may be monitored to determine whether a temperature reading at one location is out of sync with temperature readings at other locations. An electrical conductor connection associated with a location of the out of sync temperature may be determined as faulty. In another example, a Euclidean distance model and/or a correlation coefficient model may be used to identify a faulty electrical conductor connection. In this way, failure and/or potential failure of the electrical component may be predicted.

20 Claims, 8 Drawing Sheets

MONITORING OPERATING CONDITION OF ELECTRICAL COMPONENT

BACKGROUND

Electrical power systems comprise various electrical components, such as electrical switchgear. Electrical switchgear may comprise electrical conductors, electrical conductor connections, disconnect switches, fuses, and/or circuit breakers used to control and protect electrical equipment. At least some portions of electric switchgear may sustain damage over time due to temperature conditions, electrical abrasion, mechanical operation, corrosion, and other operating conditions. In one example, a loose electrical conductor connection (e.g., electrical connection between two or more electrical conductors) may increase resistance at the connection. Accordingly, when relatively high current flows through the loose electrical connection excess heat may be generated (e.g., from the increased resistance), which may lead to undesired results. For example, over time excessive temperatures can damage insulation material, melt conductors, lead to oxidation of contacts, etc. of electrical switchgear

SUMMARY

This Summary is provided to introduce a selection of concepts in a simplified form that are further described below in the detailed description. This summary is not intended to identify key factors or essential features of the claimed subject matter, nor is it intended to be used to limit the scope of the claimed subject matter.

Among other things, one or more systems and/or techniques for monitoring an operating condition of an electrical component are provided herein (e.g., monitoring electrical switchgear, which may comprise one or more electrical conductors and/or one or more electrical conductor connections). In one embodiment of monitoring an operating condition of an electrical component, an alert component may be configured to generate one or more expected temperature curves based upon a linear regression model. The linear regression model may generate an expected temperature curve based upon one or more ambient temperatures associated with the electrical component (e.g., switchgear) and/or a set of load currents associated with one or more electrical conductors, such as wires or buses, associated with the electrical component, for example. The expected temperature curve may comprise a curve that represents temperatures that may be expected during normal operation of the electrical component (e.g., the curve may represent various temperature values that may increase during peak usages times during the day and/or various temperature values that may decrease during low usage at off-peak hours). A warning threshold curve may be generated based upon a first standard deviation (e.g., a 3 sigma) from the expected temperature curve. An alarm threshold curve may be generated based upon a second standard deviation (e.g., a 6 sigma) from the expected temperature curve. In this way, a set of temperatures associated with the one or more electrical conductors (e.g., temperatures along a phase A electric conductor, temperatures along a phase B electrical conductor, temperatures along a phase C electrical conductor, etc.) may be monitored based upon the warning threshold curve, the alarm threshold curve, and/or other curves in order to determine an operating condition of the electrical component. For example, if a temperature exceeds the warning threshold curve, then a warning may be provided, which may provide early detection of a potential future failure of the electrical component.

In one embodiment of monitoring an operating condition of an electrical component, a coefficient evaluation component may be configured to evaluate at least some temperature measurements from a temperature sensor against a correlation coefficient model to determine whether one or more of such temperature measurements are out of sync with one another and/or otherwise aberrant. An out of sync temperature measurement at a temperature measuring location may, for example, indicate that an electrical conductor connection associated with the temperature measuring location may be a "hot spot" indicative of a faulty electrical connector connection, for example. In one example of utilizing the correlation coefficient model, temperature reading behavior (e.g., one or more temperature measurements) along a single path (e.g., an electrical conductor, such as a bus, having a relatively similar load and/or current along the electrical conductor) may be evaluated to determine whether temperature readings (e.g., measurements) along the path are behaving similarly (e.g., substantially similar measurements may be expected because the current along the path may be relatively similar for substantially all temperature measuring locations). For example, correlation coefficients may be derived for temperature measurement pairings along a path of a particular phase (e.g., a main bus temperature and an upper bushing temperature measured along a phase A electrical conductor, a main bus temperature and a cable connection temperature measured along a phase A electrical conductor, and/or other temperature measurement pairings measured along a phase A electrical conductor). Correlation coefficients associated with a temperature reading (e.g., measurement) may be compared against correlation coefficients of other temperature readings (e.g., measurements) to determine whether an electrical conductor connection is faulty (e.g., a faulty electrical conductor connection may have caused the temperature increase). Because temperatures along the path should be relatively similar (e.g., correlation coefficients close to 1.0), if one or more correlation coefficients of a temperature reading deviate from 1.0 beyond a threshold value, then the electrical conductor connection associated with the temperature measuring location may be regarded as faulty. In another example of utilizing the correlation coefficient model, correlation coefficients of temperature measurements of a temperature sensor along multiple phases may be correlated together to determine whether an electrical conductor connection on a phase is faulty. It may be appreciated that while determinations relative to electrical conductor connections are referred to herein, the instant application including the scope of the appended claims is not intended to be so limited. For example, the discussions, determinations, etc. may also and/or alternatively be applicable to electrical conductors. Accordingly, at least for some aspects described herein (e.g., with regard to FIG. 6), electrical conductor connection and electrical conductor may be used interchangeably.

In one embodiment of monitoring operating conditions of an electrical component, a Euclidean Distance (ED) evaluation component may use a Euclidean Distance model to evaluate temperature measurements at a temperature measuring location (e.g., measurements by a temperature sensor for a phase A, phase B, and phase C) to determine whether the temperature measurements are out of sync with one another (e.g., a temperature measurement of the phase A may be out of sync with temperature measurements of the phase B and phase C), which may indicate that an electrical conductor connection (e.g., a conductor of phase A) may be faulty. In one example of utilizing the Euclidean distance model, temperature measurements for one or more phases by a temperature sensor are evaluated, while taking into account different load currents of the phases, to determine whether such temperature measurements correlate. That is, Euclidean distances are calculated for temperature measurement parings of the temperature measurements (e.g., a first Euclidean distance for phase A and phase B, a second Euclidean distance for a phase A and a phase C, etc.). If Euclidean distances of respective temperature measurement pairings are not similar (e.g., above a threshold standard deviation), then an electrical conductor connection (e.g., a phase A electrical conductor) associated with a temperature measuring location of an out of sync temperature may be determined as faulty. In another example of utilizing the Euclidean distance model, Euclidean distances are calculated for temperature measurements along a path having a similar load current along the path. If the Euclidean distances associated with temperature readings do not correlate, then the electrical conductor connection where the temperature was measured may be determined as faulty.

The following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DETAILED DESCRIPTION

Figure 1:
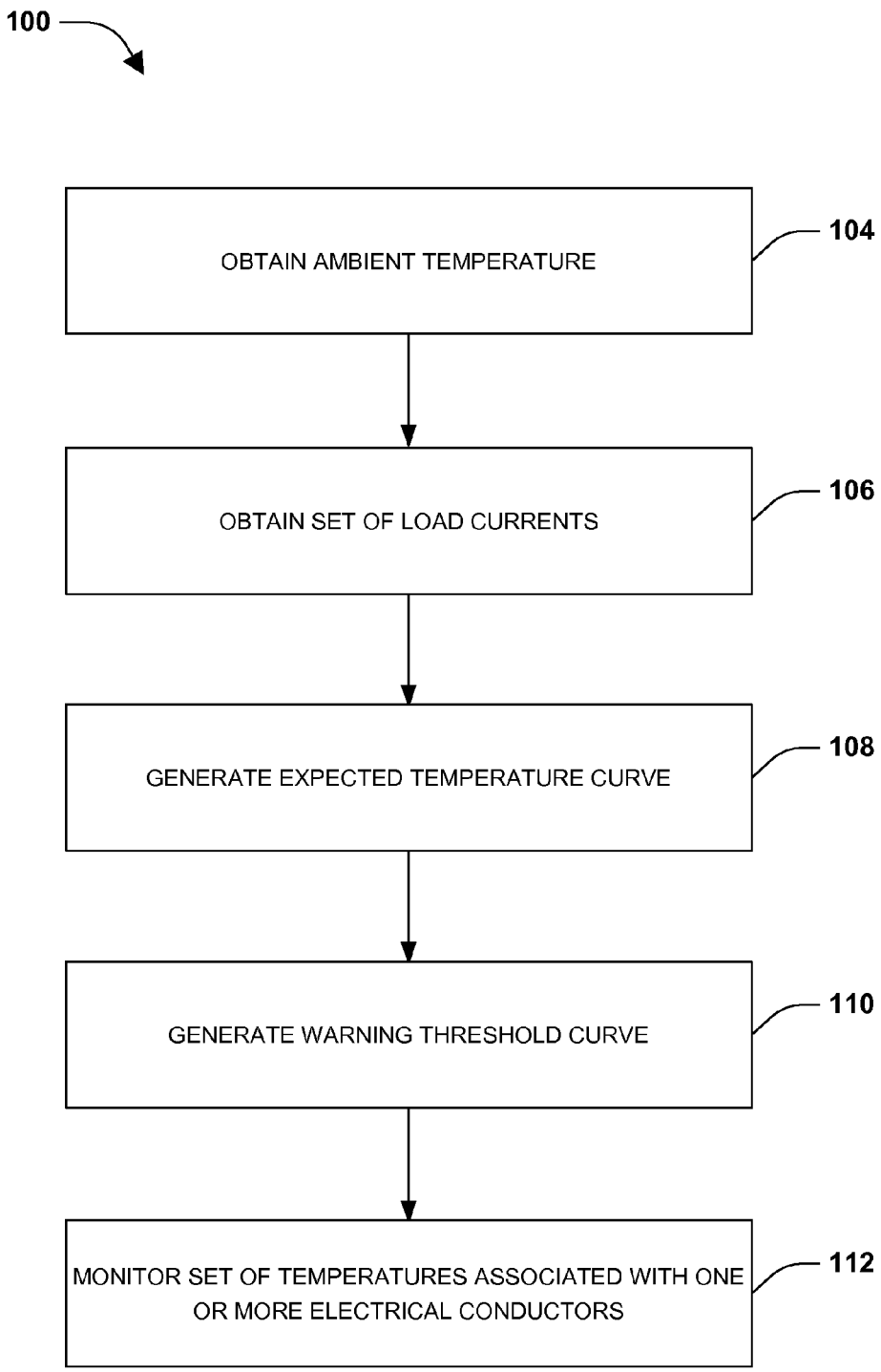
FIG. 1 is a flow diagram illustrating an exemplary method of monitoring operating conditions of an electrical component.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

As provided herein, an operating condition of an electrical component, such as electrical switchgear, for example, may be monitored for failure and/or monitored for early detection of a potential future failure. In one embodiment, one or more expected temperature curves may be generated based upon a linear regression model using an ambient temperature and/or a set of load currents associated with electrical conductors, such as buses, of the electrical component. Temperatures associated with the electrical conductors may be monitored based upon threshold curves, such as warning and/or alarm threshold curves, to determine whether such temperatures correspond to expected temperatures of the electrical conductors during normal operation. Because an expected temperature curve may take into account changes in temperature (e.g., relatively high temperatures during peak usage during the day), the expected temperature curve may provide relatively accurate, consistent, and/or early fault detection compared with other monitoring techniques that may merely use a static temperature threshold value. In another embodiment, a Euclidean distance model may be used to correlate Euclidean distances of temperature measurements associated with temperature readings to determine whether a temperature measurement at a first location behaves similarly with temperature measurements at other locations (e.g., temperature measurements for 3 phases may be correlated with one another while taking into account load current differences of respective phases). In another embodiment, a correlation coefficient model may be used to compare correlation coefficients of temperature measurements associated with temperature readings to determine whether a temperature measurement at a first location behaves similarly with temperature measurements at other locations (e.g., temperature measurements along an electrical conductor having a relatively uniform load current may be expected to have similar temperatures).

Figure 2:
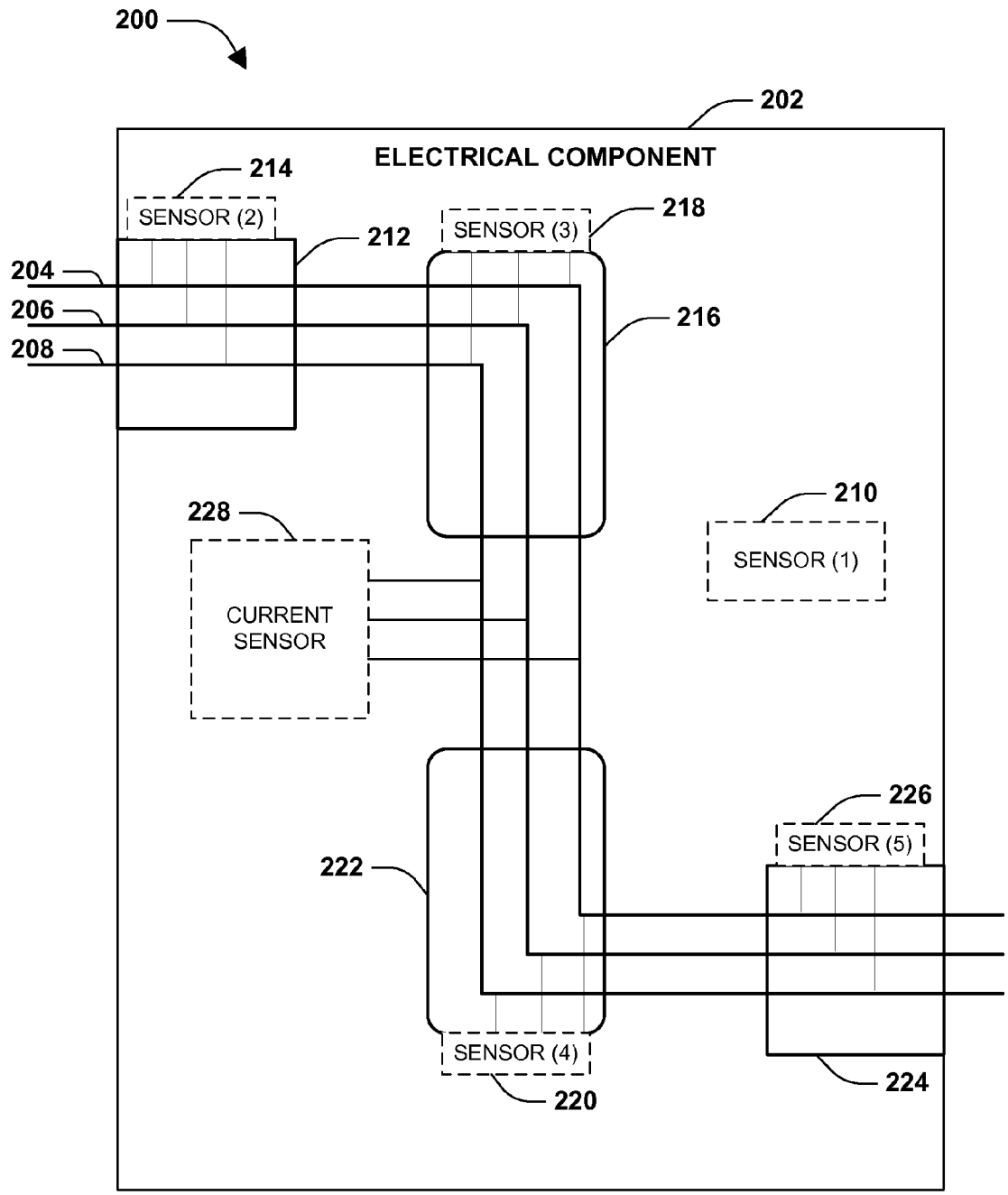
FIG. 2 is an illustration of an example of an electrical component.

One embodiment of monitoring operating conditions of an electrical component is illustrated by an exemplary method 100 in FIG. 1, and an example 200 of an exemplary electrical component 202 is illustrated in FIG. 2. It may be appreciated that the electrical component 202 may comprise various types of electrical devices, such as electrical switchgear, a three phase switch, substation equipment, a device comprising one or more conductors, etc. For example, the electrical component 202 may comprise a main bus component 212, an upper bushing component 216, a lower bushing component 222, a cable connection component 224, and/or other components not illustrated.

The electrical component 202 may comprise one or more sensors, such as temperature sensors and/or load current sensors. A first temperature sensor 210 may be configured to obtain ambient temperatures associated with the electrical component 202. A second temperature sensor 214 may be configured to obtain main bus temperatures associated with the main bus component 212 (e.g., a first main bus temperature associated with a phase A electrical conductor 204, a second main bus temperature associated with a phase B electrical conductor 206, and/or a third main bus temperature associated with a phase C electrical conductor 208). A third temperature sensor 218 may be configured to obtain upper bushing temperatures associated with the upper bushing component 216 (e.g., a first upper bushing temperature associated with the phase A electrical conductor 204, a second upper bushing temperature associated with the phase B electrical conductor 206, and/or a third upper bushing temperature associated with the phase C electrical conductor 208). A fourth temperature sensor 220 may be configured to obtain lower bushing temperatures associated with the lower bushing component 222 (e.g., a first lower bushing temperature associated with the phase A electrical conductor 204, a second lower bushing temperature associated with the phase B electrical conductor 206, and/or a third lower bushing temperature associated with the phase C electrical conductor 208). A fifth temperature sensor 226 may be configured to obtain cable connection temperatures associated with the cable connection component 224 (e.g., a first cable connection temperature associated with the phase A electrical conductor 204, a second cable connection temperature associated with the phase B electrical conductor 206, and/or a third cable connection temperature associated with the phase C electrical conductor 208). A current sensor 228 may be configured to obtain a set of loads currents associated with one or more conductors, such as buses and/or wires, of the electrical component 202 (e.g., a first load current associated with the phase A electrical conductor 204, a second load current associated with the phase B electrical conductor 206, a third load current associated with the phase C electrical conductor 208). In this way, temperature and/or current measurements associated with the electrical component 202 may be used to monitor operating conditions of the electrical component 202.

In one example of monitoring operating conditions of the electrical component 202, one or more ambient temperatures associated with the electrical component 202 may be obtained, at 104. For example, the first temperature sensor 210 may obtain a set of ambient temperatures associated with the electrical component 202, which may be used as an ambient temperature array for a linear regression model. The linear regression model may use the ambient temperature array to create one or more expected temperature curves for evaluating the operation of the electrical component 202. At 106, a set of load currents associated with one or more electrical conductors of the electrical component 202 may be obtained. For example, the current sensor 228 may measure load current(s) associated with the phase A electrical conductor 204, the phase B electrical conductor 206, and/or the phase C electrical conductor 208.

At 108, one or more expected temperature curves may be generated based upon a linear regression model using the ambient temperature (e.g., an ambient temperature array) and/or the set of load currents. For example, a first expected temperature curve may be generated for the upper bushing component 216 and/or the lower bushing component 222, a second expected temperature curve may be generated for the main bus component 212, and/or a third expected temperature curve may be generated for the cable connection component 224. It may be appreciated that one example of an expected temperature curve 406 is illustrated in example 400 of FIG. 4.

Figure 3:
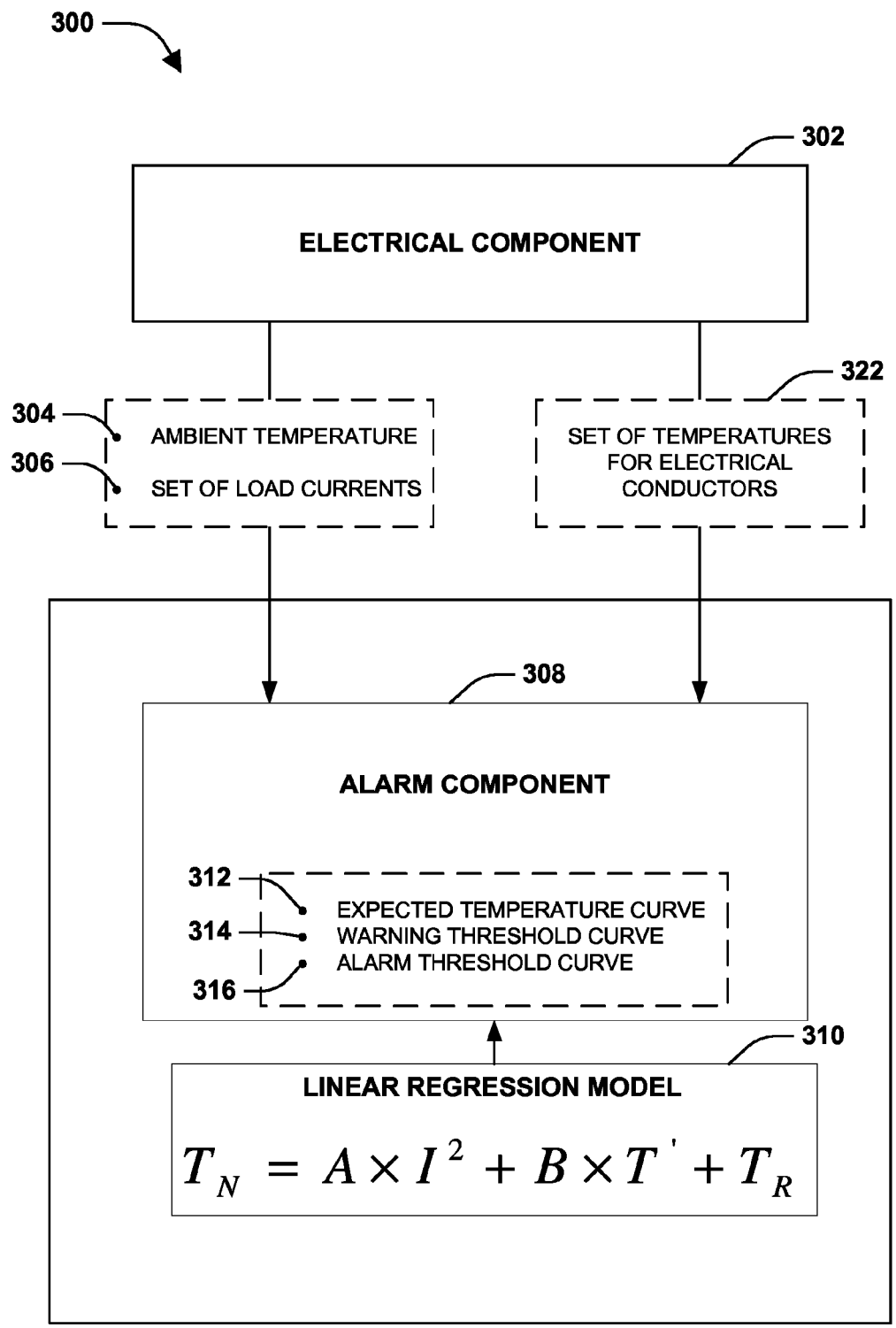
FIG. 3 is a component block diagram illustrating an exemplary system for monitoring operating conditions of an electrical component.

It may be appreciated that one example of a linear regression model 310 is illustrated in example 300 of FIG. 3. In one example, the linear regression model ($T_N = A \times I^2 + B \times T' + T_R$) may be based upon a current array coefficient (A), a load current array ($I^2$), an ambient temperature coefficient (B), an ambient temperature array (T'), and/or a reference temperature coefficient ($T_R$). The load current array ($I^2$) may be based upon the set of load currents measured by the current sensor 228, for example. The load current array ($I^2$) may take into account a time delay that corresponds to an association between a peak current and a peak temperature (e.g., the peak temperature may occur after the peak current). The ambient temperature array (T') may be based upon a set of ambient temperatures measured by the first temperature sensor 210, for example. The ambient temperature array (T') may take into account a time delay corresponding to a peak ambient temperature. The current array coefficient (A), the ambient temperature coefficient (B), and/or the reference temperature coefficient ($T_R$) may be coefficients used by the linear regression model to estimate one or more expected temperature curve (e.g., various prediction models may be used to modify the coefficients so that relatively accurate expected temperatures curves may be estimated, which may take into account various factors, such as seasonality, for example). In this way, the one or more expected temperature curve may correspond to normal operating temperatures that may be expected for the electric component 202 over time.

One or more threshold curves may be generated based upon the expected temperature curve. Such threshold curves may be used to evaluate temperatures measured from the electrical component 202. In one example, a warning threshold curve may be generated based upon a first standard deviation (e.g., a 3 sigma) from the expected temperature curve, at 110. It may be appreciated that one example of a warning threshold curve 404 is illustrated in example 400 of FIG. 4. In another example, an alarm threshold curve may be generated based upon a second standard deviation (e.g., a 6 sigma) from the expected temperature curve. It may be appreciated that one example of an alarm threshold curve 402 is illustrated in example 400 of FIG. 4.

At 112, a set of temperatures associated with the one or more electrical conductors (e.g., temperatures associated with the phase A electrical conductor 204, the phase B electrical conductor 206, and/or the phase C electrical conductor 208, which are measured by the second temperature sensor 214, the third temperature sensor 218, the fourth temperature sensor 220, and/or the fifth temperature sensor 226) may be monitored based upon the warning threshold curve 404, the alarm threshold curve 402, and/or the expected temperature curve 406, to determine an operating condition of the electrical component 202 (e.g., determine whether the electrical component 202 is faulty and/or is (slowly) becoming faulty).

Figure 4:
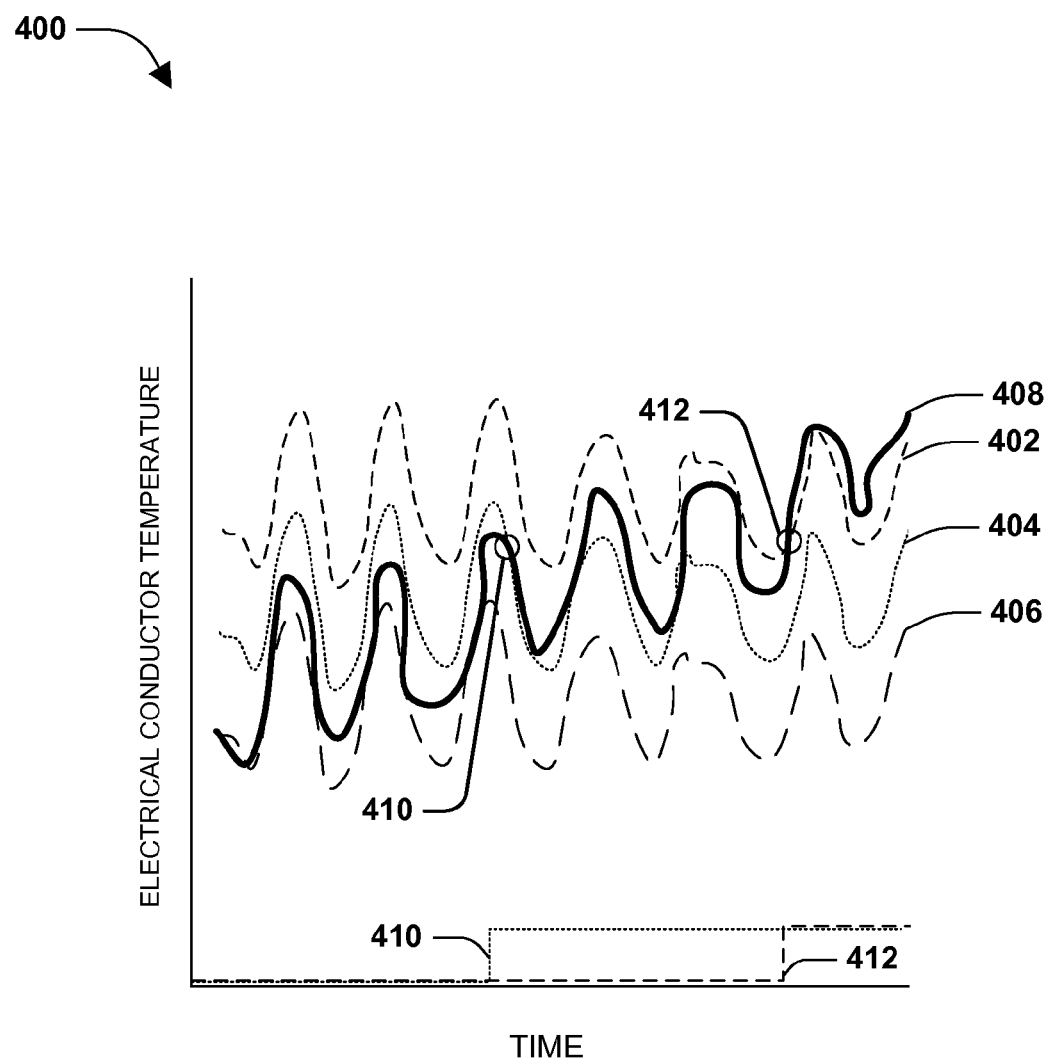
FIG. 4 is an illustration of an example of monitoring temperatures associated with an electrical component.

It may be appreciated that one example of monitoring temperatures associated with an electrical component is illustrated by example 400 in FIG. 4, where a temperature curve 408 is illustrated that corresponds to temperatures measured over time for a particular electrical component. In one example, if a current temperature 410 (e.g., a temperature of the phase A electrical conductor 204 measured by the third temperature sensor 218 at the upper bushing 216) is above the warning threshold curve 404, then a warning notification may be created. In another example, if a current temperature 412 (e.g., a temperature of the phase A electrical conductor 204 measured at a later time by the third temperature sensor 218 at the upper bushing 216) is above the alarm threshold curve 402, then an alarm notification may be created. In this way, temperatures associated with the electrical component 202 may be monitored based upon various threshold curves generated by the linear regression model 310, which may take into account variations of expected temperature over time (e.g., increases in temperature during the day and/or decreases in temperature during the night based upon varying load demand over time), as opposed to merely taking into account a discrete temperature value for alarm/warning notification.

FIG. 3 illustrates an example of a system 300 configured for monitoring operating conditions of an electrical component 302. The system 300 may comprise an alert component 308. The alert component 308 may be configured to obtain an ambient temperature 304, such as a set of ambient temperatures collected over time, associated with the electrical component 302. The alert component 308 may be configured to obtain a set of load currents 306 associated with one or more electrical conductors, such as wires or buses, of the electrical component 302.

The alert component 308 may be configured to generate an expected temperature curve 312 (e.g., expected temperature curve 406 of FIG. 4) based upon a linear regression model 310 using the ambient temperature 304 and/or the set of load currents 306. In one example, the linear regression model 310

($T_N = A \times I^2 + B \times T' + T_R$) may be based upon a current array coefficient (A), a load current array ($I^2$), an ambient temperature coefficient (B), an ambient temperature array (T'), and/or a reference temperature coefficient ($T_R$). The load current array ($I^2$) may be based upon the set of load currents 306 and/or a time delay that corresponds to an association between a peak current and a peak temperature. The ambient temperature array (T') may be based upon a set of ambient temperatures obtained (e.g., the ambient temperature 304) and/or a time delay corresponding to a peak ambient temperature. The current array coefficient (A), the ambient temperature coefficient (B), and/or the reference temperature coefficient ($T_R$) may be coefficients used by the linear regression model to estimate one or more expected temperature curve. In this way, the expected temperature curve 312 may correspond to normal operating temperatures that may be expected for the electric component 302.

The alert component 308 may be configured to generate a warning threshold curve 314 based upon a first standard deviation (e.g., a 3 sigma) from the expected temperature curve 312 (e.g., warning threshold curve 404 of FIG. 4). The alert component 308 may be configured to generate an alarm threshold curve 316 based upon a second standard deviation (e.g., a 6 sigma) from the expected temperature curve 312 (e.g., alarm threshold curve 402 of FIG. 4). In this way, the alert component 308 may monitor a set of temperatures 322 associated with the one or more electrical conductors of the electrical component 302 (e.g., a temperature curve 408 corresponding to temperatures measured over time from the electrical component 302) based upon the expected temperature curve 312, the warning threshold curve 314, and/or the alarm threshold curve 316. In one example, if a current temperature within the set of temperatures 322 rises above the warning threshold curve 314 (e.g., current temperature 410), then a warning notification may be created. In another example, if a current temperature within the set of temperatures 322 rises above the alarm threshold curve 316 (e.g., current temperature 412), then an alarm notification may be created.

Figure 5:
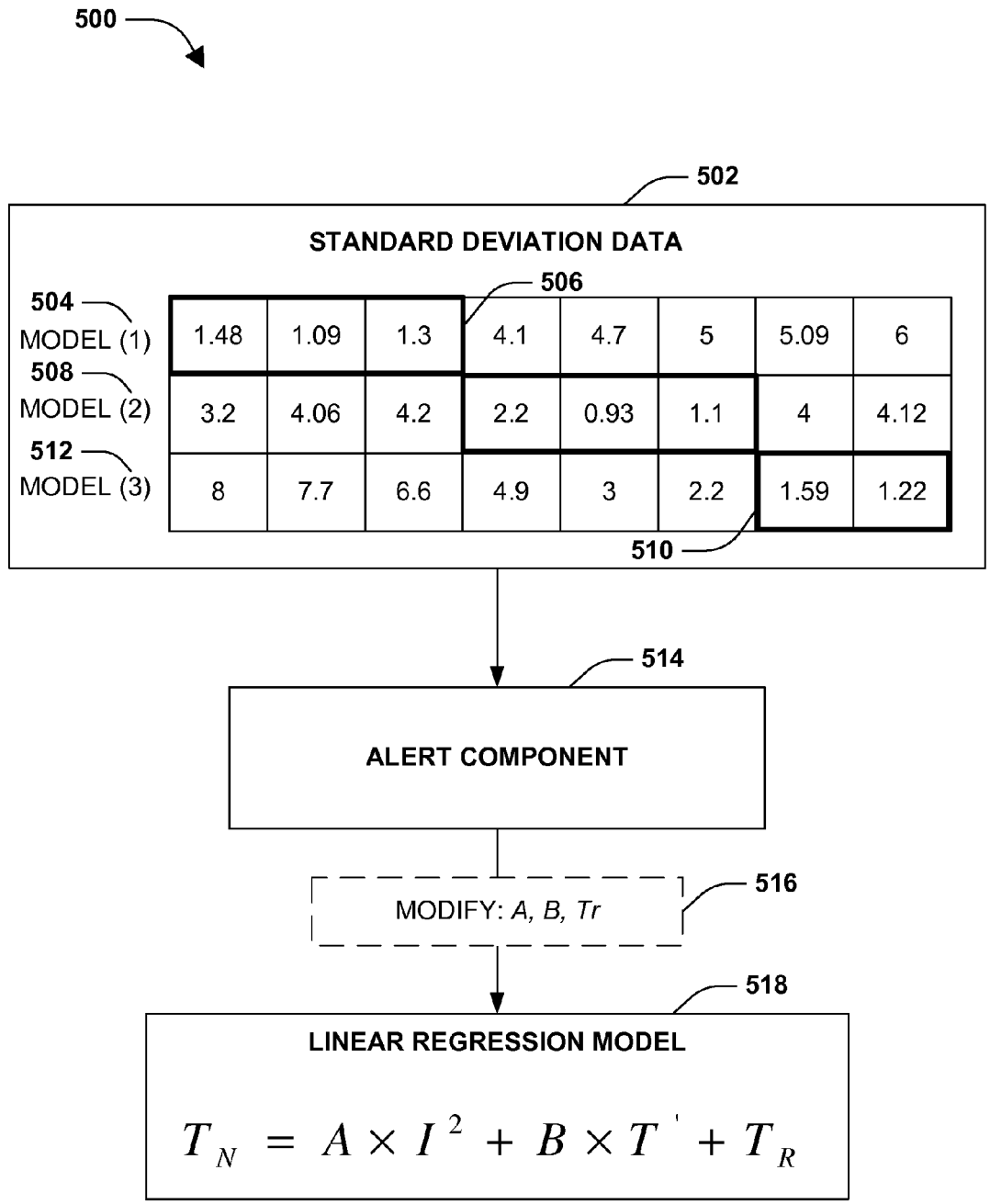
FIG. 5 is an illustration of an example of modifying a linear regression model based upon standard deviation data.

FIG. 5 illustrates an example 500 of modifying 516 a linear regression model 518 based upon standard deviation data 502. That is, the linear regression model 518 may be used to generate one or more expected temperature curves based upon various measured data (e.g., a load current array ($I^2$), an ambient temperature array (T'), etc.) and/or coefficients (e.g., a current array coefficient (A), an ambient temperature coefficient (B), a reference temperature coefficient ($T_R$), etc.). The load current array ($I^2$) and/or the ambient temperature array (T') may be derived from load current data and/or ambient temperature data measured from an electrical component. In contrast, the current array coefficient (A), the ambient temperature coefficient (B), and/or the reference temperature coefficient ($T_R$) may correspond to coefficient values derived from prediction models by the linear regression model 518 for estimating temperature data, such as expected temperatures for conductors, components, and/or phases of the electrical component during normal operation.

An alert component 514 may be configured to generate one or more expected temperature curves based upon the linear regression model 518. The alert component 514 may monitor temperatures associated with the electrical component based upon the one or more expected temperature curves to determine an operating state of the electrical component. The operating state may identify whether the electrical component is operating as expected, whether the electrical component has failed, and/or whether the electrical component may potentially fail in the future (e.g., the operating condition of the electrical component is degrading over time). Because the estimation of expected temperatures may be affected by various factors, such as seasonal weather and/or temperature changes, that may change over time, the alert component 514 may utilize different prediction models, such as a first prediction model 504, a second prediction model 508, a third prediction model 512, etc., for determining values of coefficients to use for the linear regression model 518. In one example, the first prediction model 504 may comprise values for the current array coefficient (A), the ambient temperature coefficient (B), and/or the reference temperature coefficient ($T_R$) that are relatively accurate for colder ambient temperatures, such as a winter season. The second prediction model 508 may comprise values for the coefficients that are relatively accurate for milder ambient temperatures, such as a spring season. The third prediction model 512 may comprise values for the coefficients that are relatively accurate for warmer ambient temperatures, such as a summer season.

The alert component 514 may be configured to select a particular prediction model to use for values of the current array coefficient (A), the ambient temperature coefficient (B), and/or the reference temperature coefficient ($T_R$). The alert component 514 may select a prediction model (e.g., comprising values for modifying 516 coefficients) based upon standard deviation data 502. The standard deviation data 502 may comprise one or more standard deviations between an expected temperature curve and measured temperatures of the electrical component over time. If a standard deviation of a current prediction model is above a threshold (e.g., a 2 sigma or 3 sigma), then a different prediction model may be selected to modify 516 the coefficients of the linear regression model 518. In one example, the alert component 514 may use the first prediction model 504 for three consecutive time units (e.g., hours, days, weeks, months, etc.) because the standard deviation between an expected temperature curve, generated based upon the first prediction model 504, and measured temperatures may be below a threshold difference of 3 sigma (e.g., 1.48 for the first time unit, 1.09 for the second time unit, and 1.3 for the third time unit).

Because the standard deviation for the first prediction model 504 is above the threshold of 3 sigma (e.g., 4.1) for the fourth time unit, the alert component 514 may switch 506 from the first prediction model 504 to the second prediction model 508 having a 2.2 standard deviation for the fourth time unit. In this way, the alert component 514 may modify 516 coefficients of the linear regression model 518 based upon standard deviation data between expected temperature curves, generated based upon prediction models, and measured temperatures of the electrical component (e.g., the alert component 514 may switch 510 from the second prediction model 508 to the third prediction model 512 for a seventh time unit). It may be appreciated that the standard deviation data 502 is merely an example of standard deviations used by the alert component 514 (e.g., root mean square (RMS) error data for a single phase), but could comprise other types of standard deviations (e.g., RMS error data for three phases). In one example, if a standard deviation is above a high threshold, then an alarm may be raised (e.g., as opposed to modifying 516 the linear regression model 518) because such a relatively high standard deviation may indicate a fault with the electrical component.

Figure 6:
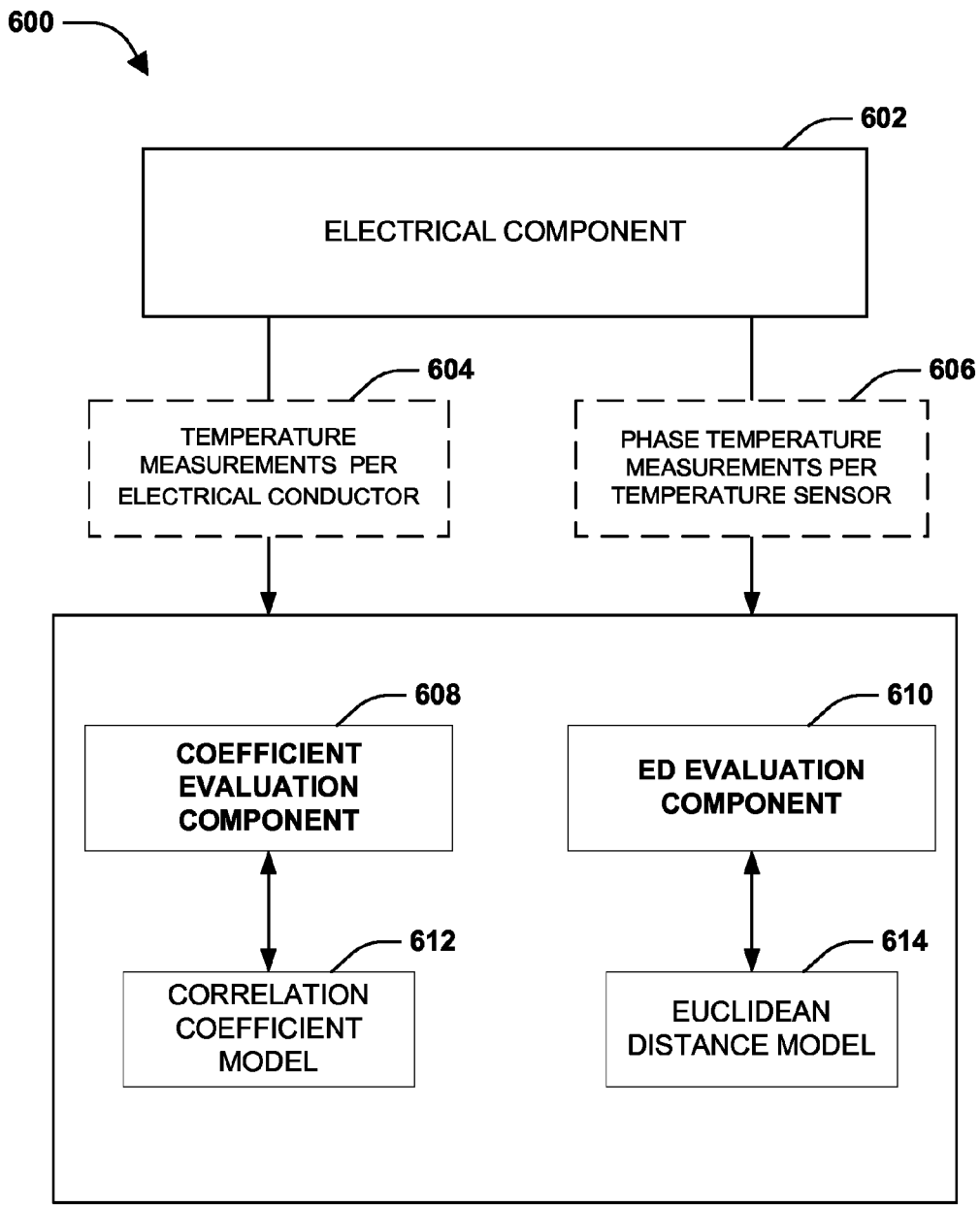
FIG. 6 is a component block diagram illustrating an exemplary system for detecting a faulty electrical conductor connection.

FIG. 6 illustrates an example of a system 600 configured for detecting a faulty electrical conductor connection. The system 600 may comprise a coefficient evaluation component 608 and/or an ED evaluation component 610. One or more temperature measurements may be associated with an electrical component 602 (e.g., temperature measurements detected by temperature sensors at temperature measuring locations within an electrical component, such as switchgear). It may be appreciated that one example of temperature sensors is illustrated by example 200 of FIG. 2 (e.g., a second temperature sensor 214 for a main bus component 212, a third temperature sensor 218 for an upper bushing component 216, a fourth temperature sensor 220 for a lower bushing component 222, a fifth temperature sensor 226 for a cable connection component 224, etc.). The coefficient evaluation component 608 and/or the ED evaluation component 610 may be configured to determine whether a temperature reading is out of sync with other temperature readings, which may indicate that an electrical conductor connection at a temperature measuring location corresponding to the out of sync temperature (e.g., a "hot spot") may be faulty based upon evaluating behavior of the temperature readings(e.g., in relation to temperatures measured for different phases and/or in relation to temperatures measured by other temperature sensors). Temperature measurements 604 per electrical conductor (e.g., temperature measurements associated with a phase A electrical conductor 204, a phase B electrical conductor 206, and/or a phase C electrical conductor 208 of FIG. 2) and/or phase temperature measurements 606 per temperature sensor may be used to evaluate whether an electrical conductor connection (e.g., where an out of sync temperature is measured) is faulty, for example.

In one example of detecting a faulty electrical conductor connection, the coefficient evaluation component 608 may be configured to generate a correlation coefficient model 612 that may be used to evaluate pairings of temperature measurements to determine whether an electrical conductor connection is faulty (e.g., based upon an out of sync temperature, such as a "hot spot", measured at a temperature measuring location associated with the electrical conductor connection). The coefficient evaluation component 608 may create the correlation coefficient model 612 for a set of temperature measurements associated with a phase of an electrical conductor. For example, the correlation coefficient model 612 may be generated for the second temperature sensor 214, the third temperature sensor 218, the fourth temperature sensor 220, and/or the fifth temperatures sensor 226 located along the phase A electrical conductor 204 of FIG. 2.

The coefficient evaluation component 608 may evaluate one or more temperature measurements (e.g., pairings of temperatures from the temperature measurements 604), measured along a phase electrical conductor, against the correlation coefficient model 612 to determine whether an electric conductor connection of a location (e.g., a temperature measuring location where an out of sync temperature, such as a "hot spot", is measured) is faulty. For example, the coefficient evaluation component 608 may determine whether a first set of temperature measurements and a second set of temperature measurements are both increasing or are both decreasing. That is, because load current along a phase (e.g., the phase A electrical conductor 204 of FIG. 2) may be relatively consistent, temperatures measured by temperature sensors along the phase should correlate (e.g., detect increasing temperatures, detect decreasing temperatures, detecting relatively similar temperature values, etc.). In this way, the coefficient evaluation component 608 may identify an electrical conductor connection that may be faulty. For example, an electrical conductor connection at a temperature measuring location (e.g., a location at which a second temperature sensor 214 may have measured an out of sync temperature) may be determined as faulty because the temperature readings at the temperature measuring location may be detecting decreasing temperatures, while temperature measurements at other locations may be detecting increasing temperatures (e.g., temperature readings by a third, fourth, and/or fifth temperature sensor) along the phase A electrical conductor 204 of FIG. 2. In another example, the coefficient evaluation component 608 may evaluate temperature measurements based upon phase temperature measurements 606 to determine whether an electrical conductor connection is faulty. For example, an electrical conductor connection at a temperature measure location (e.g., associated with a third temperature sensor) may be determined as faulty based upon phase temperature measurements at temperature measure locations for the phase A, B, and C not correlating (e.g., temperatures, adjusted based upon varying loads/currents along the phases A, B, and C, that are measured by the third temperature sensor 218 may not be similar).

In another example of detecting a faulty electrical conductor connection, the ED evaluation component 610 may be configured to generate a Euclidean distance model 614 that may be used to evaluate pairings of phase temperature measurements to determine whether an electrical conductor connection is faulty. For example, the ED evaluation component 610 may create the Euclidean distance model 614 for a pair of phase measurements by one or more temperature sensors (e.g., temperatures associated with the phase A electrical conductor 204, the phase B electrical conductor 206, and/or the phase C electrical conductor 208 of FIG. 2).

The ED evaluation component 610 may evaluate phase temperature measurements per temperature sensor (e.g., pairings of phase temperatures from the phase temperature measurements 606) against the Euclidean distance model 614 to determine whether an electrical conductor connection is faulty. In one example, the ED evaluation component 610 may generate the Euclidian distance model 614 based upon ambient temperature and/or a set of load currents associated with the electrical component to compensate for differences (e.g., load and/or current differences) between one or more phases, such as a phase A, a phase B, and/or a phase C. In this way, the ED evaluation component 610 may compare Euclidean distances between phase pairings (e.g., a first Euclidean distance between a phase A temperature measurement and a phase B temperature measurement of the second temperature sensor 214, a second Euclidean distance between the phase A temperature and a phase C temperature measurement of the second temperature sensor 214, and/or a third Euclidean distance between the phase B temperature measurement and the phase C temperature measurement of the second temperature sensor 214 of FIG. 2). If the Euclidean distances between respective phase pairings deviate above a threshold, then an electrical conductor connection (e.g., associated with a temperature measuring location at which an out of sync temperature, such as a temperature of phase A, was measured) may be determined as faulty (e.g., Euclidean distance of phase A and phase B, and the Euclidean distance of phase A and the phase C may deviate, such as by a 3 sigma or a 6 sigma, while Euclidean distance of phase B and phase C may not deviate). In another example, the ED evaluation component 610 may evaluate temperature measurements 604 per electrical conductor (e.g., per phase electrical conductor) to determine whether an electrical conductor connection at a temperature measuring location is faulty. For example, the ED evaluation component 610 may evaluate Euclidean distances between temperature measurements along the phase A electrical conductor 204 by the second, third, fourth, and/or fifth temperature sensor (e.g., pairings of Euclidean distances of two temperature sensors). If a Euclidean distance of a temperature measurement does not correlate to Euclidean distances of other temperature measurements, then an electrical conductor connection where the non-correlating temperature is measured may be determined to be faulty.

Figure 7:
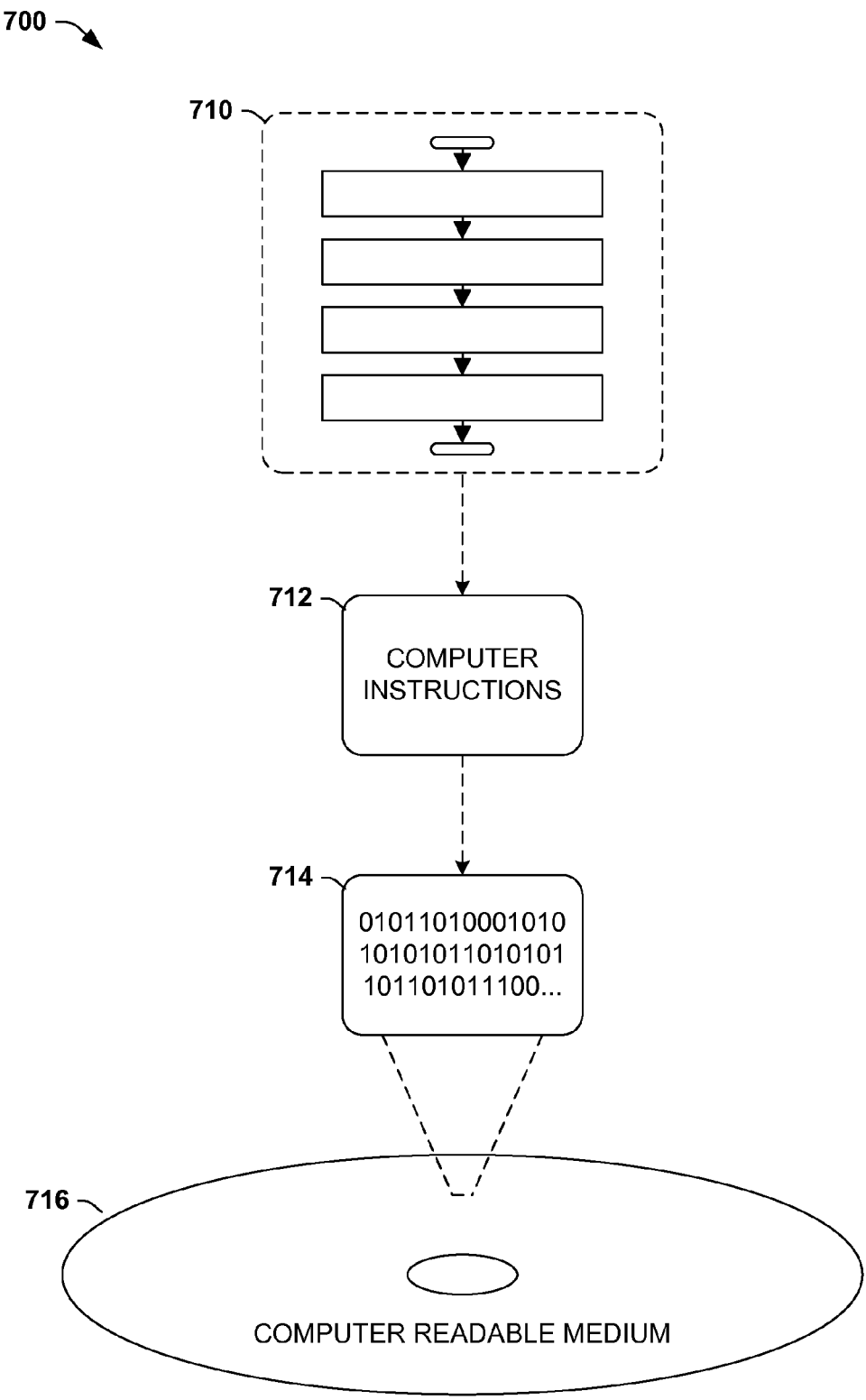
FIG. 7 is an illustration of an exemplary computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium that may be devised in these ways is illustrated in FIG. 7, wherein the implementation 700 comprises a computer-readable medium 716 (e.g., a CD-R, DVD-R, or a platter of a hard disk drive), on which is encoded computer-readable data 714. This computer-readable data 714 in turn comprises a set of computer instructions 712 configured to operate according to one or more of the principles set forth herein. In one such embodiment 700, the processor-executable computer instructions 712 may be configured to perform a method 710, such as at least some of the exemplary method 100 of FIG. 1, for example. In another such embodiment, the processor-executable instructions 712 may be configured to implement a system, such as at least some of the exemplary system 300 of FIG. 3, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 8:
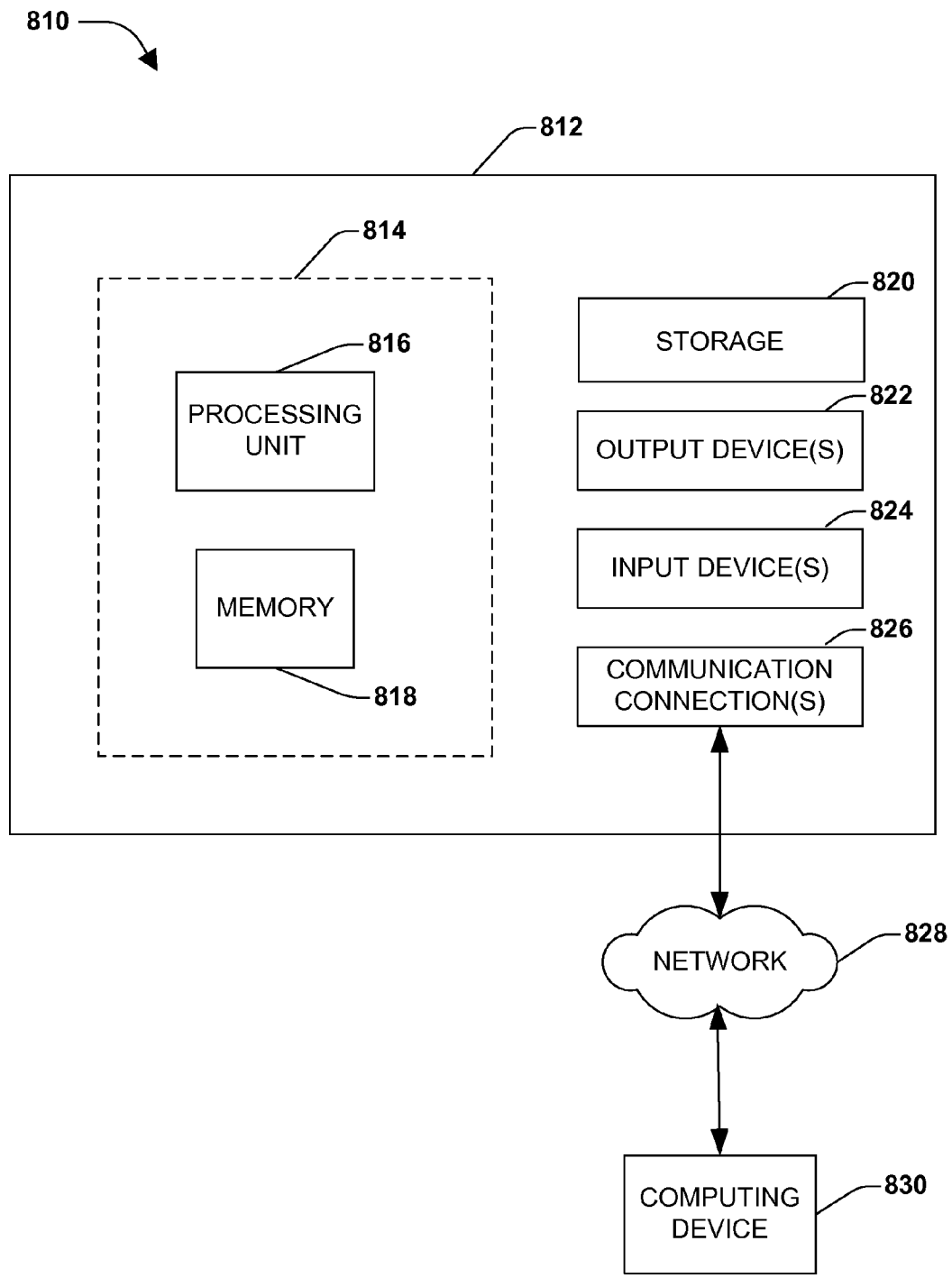
FIG. 8 illustrates an exemplary computing environment wherein one or more of the provisions set forth herein may be implemented.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 illustrates an example of a system 810 comprising a computing device 812 configured to implement one or more embodiments provided herein. In one configuration, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In other embodiments, device 812 may include additional features and/or functionality. For example, device 812 may also include additional storage (e.g., removable and/or non-removable) including, but not limited to, magnetic storage, optical storage, and the like. Such additional storage is illustrated in FIG. 8 by storage 820. In one embodiment, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media may be part of device 812.

Device 812 may also include communication connection(s) 826 that allows device 812 to communicate with other devices. Communication connection(s) 826 may include, but is not limited to, a modem, a Network Interface Card (NIC), an integrated network interface, a radio frequency transmitter/receiver, an infrared port, a USB connection, or other interfaces for connecting computing device 812 to other computing devices. Communication connection(s) 826 may include a wired connection or a wireless connection. Communication connection(s) 826 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in device 812. Input device(s) 824 and output device(s) 822 may be connected to device 812 via a wired connection, wireless connection, or any combination thereof. In one embodiment, an input device or an output device from another computing device may be used as input device(s) 824 or output device(s) 822 for computing device 812.

Components of computing device 812 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 812 may be interconnected by a network. For example, memory 818 may be comprised of multiple physical memory units located in different physical locations interconnected by a network.

Those skilled in the art will realize that storage devices utilized to store computer readable instructions may be distributed across a network. For example, a computing device 830 accessible via a network 828 may store computer readable instructions to implement one or more embodiments provided herein. Computing device 812 may access computing device 830 and download a part or all of the computer readable instructions for execution. Alternatively, computing device 812 may download pieces of the computer readable instructions, as needed, or some instructions may be executed at computing device 812 and some at computing device 830.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B and/or the like generally means A or B or both A and B.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method for monitoring an operating condition of an electrical component, comprising:
   obtaining an ambient temperature associated with an electrical component;
   obtaining a set of load currents associated with one or more electrical conductors of the electrical component;
   generating an expected temperature curve based upon a linear regression model using the ambient temperature and the set of load currents;
   generating a warning threshold curve based upon a first standard deviation from the expected temperature curve; and
   monitoring a set of temperatures associated with the one or more electrical conductors based upon the warning threshold curve to determine an operating condition of the electrical component.

2. The method of claim 1, comprising:
   generating an alarm threshold curve based upon a second standard deviation from the expected temperature curve.

3. The method of claim 1, the linear regression model based upon a current array coefficient, a load current array, an ambient temperature coefficient, an ambient temperature array, and a reference temperature coefficient.

4. The method of claim 3, the load current array comprising a time delay corresponding to an association between a peak current and a peak temperature of an electrical conductor.

5. The method of claim 3, the ambient temperature array comprising a time delay corresponding to a peak ambient temperature.

6. The method of claim 3, comprising:
   modifying at least one of the current array coefficient, the ambient temperature coefficient, or the reference temperature coefficient based upon a deviation of the expected temperature curve from a measured temperature of the electrical component.

7. The method of claim 1, the electrical component comprising a three phase switch.

8. The method of claim 1, comprising:
   generating a correlation coefficient model associated with a set of temperature sensors for a phase of an electrical conductor; and
   evaluating one or more temperature measurements of the set of temperature sensors against the correlation coefficient model to determine whether a temperature measurement at a temperature measuring location indicates that an electrical conductor connection associated with the temperature measuring location is faulty.

9. The method of claim 8, the evaluating one or more temperature measurements comprising:
   determining whether a first set of temperature measurements and a second set of temperature measurements are both increasing or decreasing.

10. The method of claim 1, comprising:
    generating a Euclidean distance model associated with one or more phases monitored by a temperature sensor; and
    evaluating one or more phase temperature measurements measured by the temperature sensor against the Euclidean distance model to determine whether a temperature measurement at a temperature measuring location indicates that an electrical conductor connection associated with the temperature measuring location is faulty.

11. The method of claim 10, the Euclidean distance model based upon the ambient temperature and the set of load currents to compensate for differences between the one or more phases.

12. A system configured for monitoring an operating condition of an electrical component, comprising:
    an alert component configured to:
       obtain an ambient temperature associated with an electrical component;
       obtain a set of load currents associated with one or more electrical conductors of the electrical component;
       generate an expected temperature curve based upon a linear regression model using the ambient temperature and the set of load currents;
       generate a warning threshold curve based upon a first standard deviation from the expected temperature curve; and
       monitor a set of temperatures associated with the one or more electrical conductors based upon the warning threshold curve to determine an operating condition of the electrical component.

13. The system of claim 12, comprising:
    an ED evaluation component configured to:
       generate a Euclidean distance model associated with one or more phases monitored by a temperature sensor; and
       evaluate one or more phase temperature measurements measured by the temperature sensor against the Euclidean distance model to determine whether a temperature measurement at a temperature measuring location indicates that an electrical conductor connection associated with the temperature measuring location is faulty.

14. The system of claim 12, comprising:
    a coefficient evaluation component configured to:
       generate a correlation coefficient model associated with a set of temperature sensors for a phase of an electrical conductor; and
       evaluate one or more temperature measurements of the set of temperature sensors against the correlation coefficient model to determine whether a temperature measurement at a temperature measuring location indicates that an electrical conductor connection associated with the temperature measuring location is faulty.

15. The system of claim 12, the linear regression model based upon a current array coefficient, a load current array, an ambient temperature coefficient, an ambient temperature array, and a reference temperature coefficient.

16. The system of claim 15, the alert component configured to:
    modify at least one of the current array coefficient, the ambient temperature coefficient, or the reference temperature coefficient based upon a deviation of the expected temperature curve from a measured temperature of the electrical component.

17. The system of claim 12, the alert component configured to:
    generate an alarm threshold curve based upon a second standard deviation from the expected temperature curve.

18. A system for monitoring an operating condition of an electrical component, comprising:
    an alert component configured to:
       monitor operating conditions of an electrical component using a set of temperature sensors; and
    an ED evaluation component configured to:
       generate a Euclidean distance model associated with one or more phases monitored by a temperature sensor; and
       evaluate one or more phase temperature measurements measured by the temperature sensor against the Euclidean distance model to determine whether a temperature measurement at a temperature measuring location indicates that an electrical conductor connection associated with the temperature measuring location is faulty.

19. The system of claim 18, the alert component configured to:
    monitor a set of temperatures associated with one or more electrical conductors of the electrical component based upon an expected temperature curve generated from a linear regression module using an ambient temperature associated with the electrical component and a set of load currents associated with the one or more electrical conductors.

20. The system of claim 18, comprising:
    a coefficient evaluation component configured to:
       generate a correlation coefficient model associated with the set of temperature sensors for a phase of an electrical conductor; and
       evaluate one or more temperature measurements of the set of temperature sensors against the correlation coefficient model to determine whether a temperature measurement at a temperature measuring location indicates that an electrical conductor connection associated with the temperature measuring location is faulty.

* * * * *